United States Patent
Ryu et al.

(10) Patent No.: US 7,279,662 B2
(45) Date of Patent: Oct. 9, 2007

(54) TEMPERATURE CONTROL DEVICE ADAPTED TO PREVENT OVERHEATING

(75) Inventors: Jae-Woo Ryu, Osan-si (KR); Chang-Soo Kim, Suwon-si (KR); Hyoung-Kyu Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/362,135

(22) Filed: Feb. 27, 2006

(65) Prior Publication Data
US 2006/0237437 A1 Oct. 26, 2006

(30) Foreign Application Priority Data
Apr. 20, 2005 (KR) ...................... 10-2005-0032659

(51) Int. Cl.
*H05B 1/02* (2006.01)
(52) U.S. Cl. .................................................. 219/506
(58) Field of Classification Search ........ 219/483–486, 219/501, 497, 494, 499, 505, 481, 508
See application file for complete search history.

(56) References Cited
U.S. PATENT DOCUMENTS

| | | | |
|---|---|---|---|
| 4,209,258 A | * | 6/1980 | Oakes .................. 366/138 |
| 4,350,553 A | * | 9/1982 | Mendes ................ 156/345.15 |
| 6,059,986 A | | 5/2000 | Jung et al. |
| 6,167,891 B1 | | 1/2001 | Kudelka et al. |
| 6,442,366 B1 | * | 8/2002 | Hartley et al. ........... 399/336 |
| 2003/0012254 A1 | | 1/2003 | Park et al. |

\* cited by examiner

*Primary Examiner*—Mark Paschall
(74) *Attorney, Agent, or Firm*—Volentine & Whitt, PLLC

(57) ABSTRACT

A temperature control device comprising a heater, a plurality of heater temperature sensors, a heater temperature controller, and a power supply unit, and adapted to prevent overheating and fires caused by the overheating of a heater, is disclosed. The heater adapted to increase in temperature in response to receiving power, each heater temperature sensor is adapted to sense a temperature of the heater and generate a corresponding sensed heater temperature, and the heater temperature controller is adapted to generate an interlock control signal when at least one of the sensed heater temperatures respectively sensed by the plurality of temperature sensors exceeds a heater reference temperature. In addition, the power supply unit is adapted to stop supplying power to a power supply controller, thereby stopping power from being supplied to the heater, when the heater temperature controller provides the interlock control signal to the power supply unit.

13 Claims, 3 Drawing Sheets

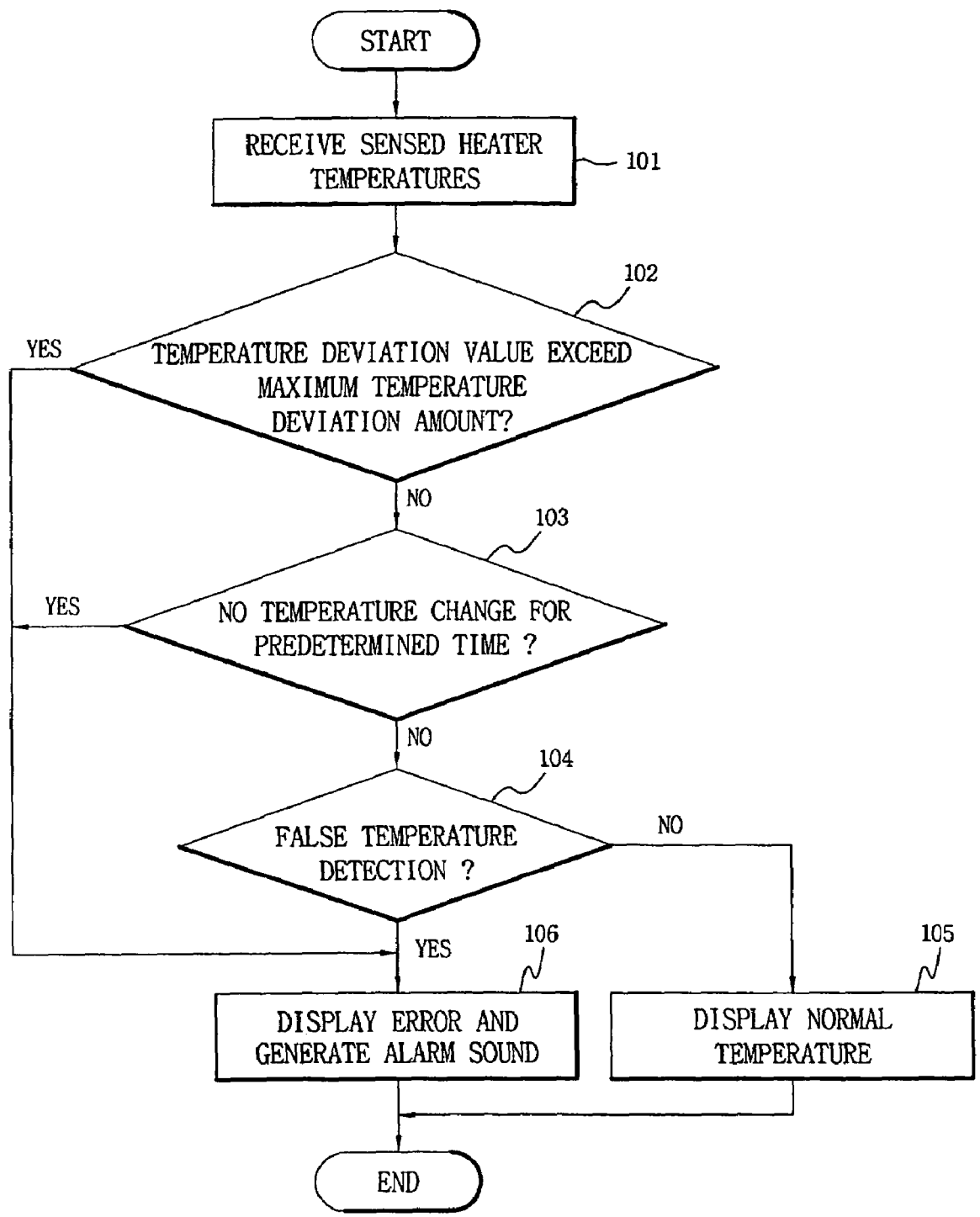

TEMPERATURE CONTROL DEVICE ADAPTED TO PREVENT OVERHEATING

BACKGROUND

1. Field of the Invention

Embodiments of the invention relate to a temperature controller. More particularly, embodiments of the invention relate to a device adapted to prevent a heater from overheating.

This application claims priority to Korean Patent Application No. 2005-0032659, filed on Apr. 20, 2005, the subject matter of which is hereby incorporated by reference in its entirety.

2. Description of the Related Art

In general, semiconductor devices are fabricated through a complicated series of fabrication processes. Various fabrication processes use various kinds of chemicals and chemical application techniques. One chemical application technique uses a bath filled with the chemical. An etching process is one type of semiconductor fabrication process commonly adapted for use with a chemical bath. Following an etching process the chemical bath is frequently used to remove unwanted films and generally clean the surface of a wafer being processed.

The application of cleaning and/or etching chemicals to a wafer is often accomplished using a so-called "overflow method" in which pure (e.g., uncontaminated) chemical flowing from a chemical bath pour over the wafer. Alternatively, a wafer to be cleaned may undergo a two-step cleaning process including immersion in a first bath (a so-called Quick Drop Rinse (QDR) bath) followed by a second (final) bath.

In a cleaning or wet-etching process performed using a chemical bath, the etching rate achieved by the process is generally proportional to the temperature of the chemical in the chemical bath, so etching rates change in accordance with changes in the temperature of the chemical. Therefore, changes in the chemical's temperature may result in over-etching or under-etching during the etching process which can have serious negative effects on the quality of the products being fabricated. Such results may, however, be avoided by uniformly maintaining the temperature of the chemical bath during the cleaning or wet-etching process.

One conventional chemical temperature control device senses the temperature of the chemical periodically and, in accordance with whether the sensed temperature of the chemical is within the desired temperature range (hereafter, the "control temperature") for the process being performed, performs the appropriate operation(s) required to maintain the chemical at the control temperature.

In one common temperature control device, the temperature of the chemical is determined by sensing a resistance change in a temperature sensor. To maintain the temperature of the chemical at a uniform level, when the sensed temperature is lower than the control temperature, the temperature control device supplies power to turn ON a heater until the control temperature is reached. In contrast, so long as the sensed temperature remains higher than the control temperature, the temperature control device does not turn ON the heater.

Thus, in the conventional temperature control device, the heater is turned ON and OFF in accordance with the temperature sensed by the temperature sensor. In the conventional temperature control device, the ON-state of the heater is termed the "reverse operation," while the OFF-state of the heater, during which state the chemical bath is allowed to normally cool, is termed the "normal operation."

The electrical current (e.g., the power) supplied to the heater is characterized by the well known relationship; Current (I)=Voltage (V)/Resistance (R), wherein resistance (R) and current (I) are inversely proportional. In the reverse operation, as the resistance of the temperature sensor increases, current falls and the temperature bias increases. In the normal operation, as the resistance of the temperature sensor decreases, current increases and the temperature bias decreases. As used herein, the term "temperature bias" refers to the amount by which the temperature sensed by the temperature sensor is greater than the actual temperature of the chemical bath.

In one possibility, the specific resistance of the temperature sensor may increase due to corrosion or some environmental change, for example. In such cases, the temperature bias will increase accordingly. For example, when the specific resistance of the temperature sensor increases by 3.8 Ω, temperature bias increases by 10° C. When an increase in the specific resistance of the temperature sensor causes the temperature "sensed" by the temperature sensor to increase erroneously without a corresponding increase in the actual temperature of the chemical bath, the actual temperature of the chemical bath will fall below the temperature supposedly sensed by the temperature sensor. That is, the temperature sensor may report that the chemical bath has attained the desired control temperature when it has not.

In the other possibility, the specific resistance of the temperature sensor may decrease due to corrosion or some environmental change. In such cases, temperature bias will decrease accordingly. When a decrease in the specific resistance of the temperature sensor causes the "sensed" temperature to be less than the actual temperature of the chemical bath, the actual temperature of the chemical bath may rise well above the control temperature without being properly indicated by the temperature sensor. Thus, the temperature sensor may report that the chemical bath has not attained the control temperature when is actually has, and may have actually exceeded it.

In either case, when the temperature sensor erroneously indicates that the chemical has attained the control temperature when is, in fact, is actually higher or lower than the control temperature, fabrication errors (e.g., under-etching or over-etching) may occur in the semiconductor fabrication process, which may produce defects in the semiconductor device being processed.

One conventional temperature control device adapted for use within a wet etching or cleaning station is disclosed, for example, in U.S. Pat. No. 6,059,986. In this conventional temperature control device, an alarm is generated visually and aurally to prevent fabrication errors that might otherwise occur when a heater and a power supply control unit are short-circuited due to corrosion.

In this type of conventional chemical temperature control device, if a chemical circulating pipe or pump is damaged and, as a result, the chemical cannot circulate through a chemical circulating pipe, the temperature of the chemical bath will fall. In response, a heater may heat an associated heating pipe (i.e., a portion of the chemical circulating pipe). However, because of the damaged pump or pipe, the chemical is not circulating through the heating pipe. Because the chemical is not circulating through the heating pipe, the temperature of the chemical in the heating pipe continues to rise while the bulk of the chemical bath cools to room temperature. When this situation occurs, the temperature sensor, which is disposed in relation to the heater, senses the heat generated by the heater, and when the heater overheats its control point, an associated controller generates an interlock control signal to interrupt power being supplied to the heater.

Figure (FIG.) 1 illustrates a temperature control device and its relation to a wet etching or cleaning station having the functionality described above in accordance with a conventional temperature control device. The conventional temperature control device of FIG. 1 will now be described in some additional detail.

A chemical bath 10 contains chemical solution, and the chemical solution in chemical bath 10 is circulated through pipe 28 and back to chemical bath 10 in the direction indicated by the arrows disposed along the inner side of pipe 28 in FIG. 1. A pump 20 disposed around pipe 28 performs a pumping operation to circulate the chemical solution of chemical bath 10 through pipe 28. As pump 20 pumps the chemical solution, a heater 22, which is separated from pump 20, heats a section of pipe 28, and thereby heats the chemical solution circulating through pipe 28. In this manner, the chemical solution may attain the desired control temperature. The control temperature provided by heater 22 for one selected fabrication process ranges from between about 250° C. to 400° C.

In the foregoing configuration, a first temperature sensor 12 is disposed in chemical bath 10, senses the temperature of the chemical solution in chemical bath 10, and provides this information to chemical temperature controller 14. Chemical temperature controller 14 compares the sensed chemical solution temperature with a control (or predetermined reference) temperature, and outputs a chemical solution temperature control signal, which may be either a power supply control signal or a power cutoff control signal, to a power supply controller 18.

When the sensed temperature is lower than the control temperature, chemical temperature controller 14 provides the power supply control signal; and thus, power supply controller 18 begins or continues to supply power to heater 22. When the sensed temperature is higher than the control temperature, chemical temperature controller 14 provides the power cutoff control signal to power supply controller 18; and thus, power supply controller 18 stops supplying power to heater 22.

A power supply part 16 selectively outputs power received from an Alternating Current (AC) power source in response to an interlock control signal. Power supply part 16 comprises a power switch and provides power to power supply controller 18 when the power switch is turned ON. Power supply controller 18 may be realized as, for example, by use of a silicon controlled rectifier (SCR). As described previously, power supply controller 18 selectively supplies the power received from power supply part 16 to a heater 22 in response to the chemical solution temperature control signal. When power supply controller 18 supplies power to heater 22, the temperature of heater 22 increases. When power supply controller 18 does not supply power to heater 22, the temperature of heater 22 falls.

Through these operations, heater 22 heats or stops heating pipe 28 in accordance with the temperature sensed by first temperature sensor 12. In other words, if the temperature sensed by first temperature sensor 12 (i.e., the sensed chemical solution temperature) has not reached the desired control temperature (i.e., a temperature ascribed to the desired fabrication process which in several common embodiments ranges between about 70° C. to 150° C.), heater 22 heats the heating pipe (e.g., a portion of pipe 28 disposed within heater 22) in accordance with the operation of power supply controller 18.

However, if the temperature sensed by first temperature sensor 12 has reached the control temperature, then heater 22 temporarily stops heating the heating pipe in accordance with the operation of power supply controller 18. The temperature of the chemical solution in chemical bath 10 is controlled as necessary through repeated application of the operations described above.

A second temperature sensor 24 is disposed on an external face of the heating pipe disposed within heater 22. Second temperature sensor 24 senses the temperature of heater 22 and provides a corresponding sensed-heater temperature to a heater temperature controller 26. Heater temperature controller 26 compares the sensed-heater temperature with a predetermined heater reference temperature (i.e., a heater overheating prevention reference temperature), and, when the sensed-heater temperature exceeds the predetermined heater reference temperature, provides an interlock control signal to power supply part 16 to stop power supply part 16 from supplying power to power supply controller 18.

However, in the conventional chemical temperature control device, if chemical solution is not circulating through pipe 28 because pipe 28 is damaged or clogged, or because pump 20 has broken down, the temperature of the chemical solution in chemical bath 10 will fall while heater 22 continues to heat the heating pipe. Under such circumstances the temperature of heater 22 and the heated pipe may increase very dramatically. Then, if second temperature sensor 24 disposed in heater 22 corrodes or a sensing line is short circuited, heater temperature controller 26 will not generate the interlock control signal, and power supply part 16 will continue to supply power to power supply controller 18. Thus, power supply controller 18 will continue to supply power to heater 22, and heater 22 will overheat. In extreme cases, overheating may actually cause a fire.

SUMMARY OF THE INVENTION

In one embodiment, the invention provides a temperature control device comprising a heater adapted to increase in temperature in response to received power; a plurality of heater temperature sensors, wherein each heater temperature sensor is adapted to sense a temperature of the heater and generate a corresponding sensed heater temperature; and, a heater temperature controller adapted to generate an interlock control signal when at least one of the sensed heater temperatures respectively sensed by the plurality of temperature sensors exceeds a heater reference temperature. The temperature control device further comprises a power supply unit adapted to stop supplying power to a power supply controller when the heater temperature controller provides the interlock control signal to the power supply unit, wherein power is provided to the power supply unit by an Alternating Current (AC) power source.

In another embodiment, the invention provides a temperature control device comprising a heater adapted to increase in temperature in response to received power; a plurality of heater temperature sensors, wherein each heater temperature sensor is adapted to sense a temperature of the heater and generate a corresponding sensed heater temperature; and, a plurality of heater temperature controllers, wherein each heater temperature controller is adapted to receive a respective sensed heater temperature and generate an interlock control signal when the received sensed heater temperature exceeds a heater reference temperature. The temperature control device further comprises a power supply unit adapted to stop supplying power to a power supply controller when at least one of the heater temperature controllers provides the interlock control signal to the power supply unit, wherein power is provided to the power supply unit by an Alternating Current (AC) power source.

In yet another embodiment, the invention provides a temperature control device comprising a bath containing a solution; a solution temperature sensor disposed within the bath and adapted to sense the temperature of the solution; a solution temperature controller adapted to receive a sensed solution temperature from the solution temperature sensor, compare the sensed solution temperature with a solution reference temperature, and output a solution temperature control signal; and, a power supply unit adapted to selectively provide power from an AC power source to a power supply controller in response to an interlock control signal, wherein the power supply controller is adapted to selectively provide power to a heater in accordance with the solution temperature control signal received from the solution temperature controller. The temperature control device further comprises a pipe; a pump disposed around the pipe and adapted to perform a pumping operation to circulate the solution through the pipe; a heater adapted to heat the solution circulated through the pipe; a plurality of heater temperature sensors disposed in the heater, wherein each heater temperature sensor is adapted to sense a temperature of the heater; and, a heater temperature controller adapted to receive a plurality of sensed heater temperatures respectively sensed by the plurality of heater temperature sensors, compare each of the sensed heater temperatures with a heater reference temperature, and provide an interlock control signal into the power supply unit when at least one of the sensed heater temperatures exceeds the heater reference temperature.

BRIEF DESCRIPTION OF THE DRAWINGS

Exemplary embodiments of the invention will now be described with reference to the accompanying drawings, in which.

DESCRIPTION OF THE EXEMPLARY EMBODIMENTS

Hereinafter, exemplary embodiments of the present invention will be described in some additional detail with reference to FIGS. 2 and 3. For purposes of clarity, detailed description of known functions and systems has been omitted.

Figure 1:
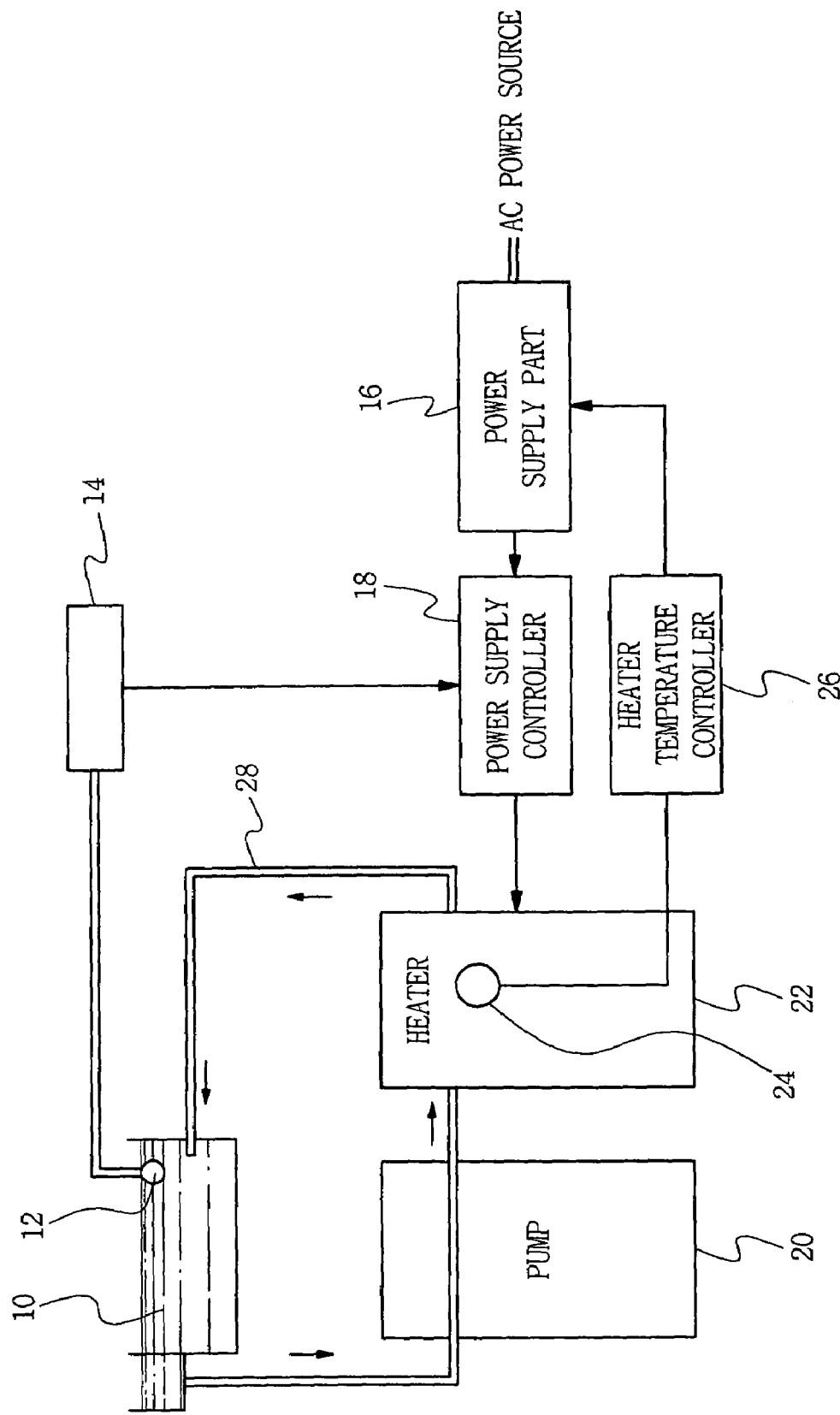
FIG. 1 is a block diagram illustrating a conventional temperature control device for a wet station.
Figure 2:
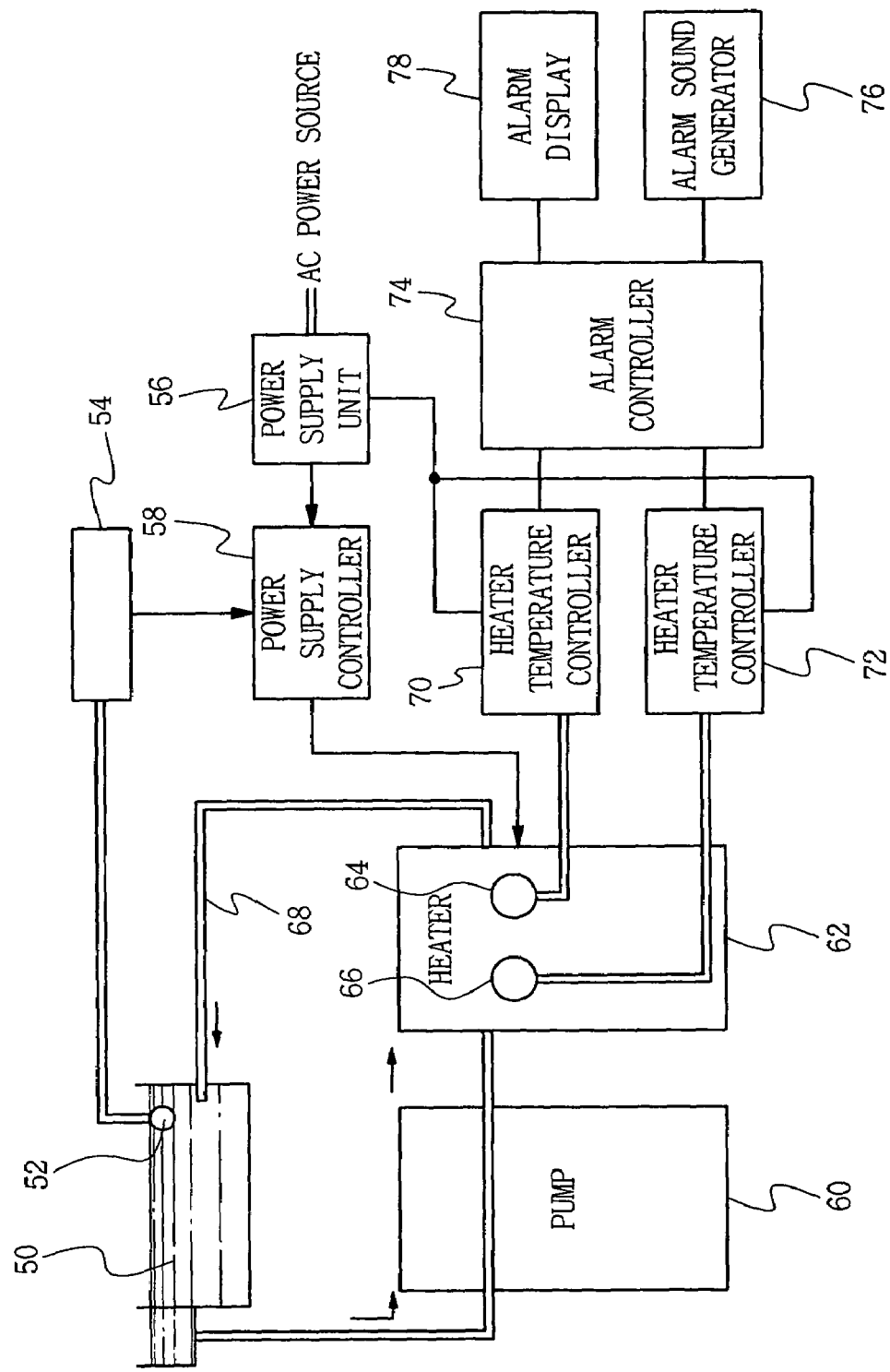
FIG. 2 is a block diagram illustrating a temperature control device for a wet station adapted to prevent a heater from overheating in accordance with an exemplary embodiment of the invention; and, FIG. 3 is a flowchart of a process for detecting the occurrence of an error in at least one heater temperature sensor and generating a warning in accordance with an exemplary embodiment of the invention.

FIG. 2 is a block diagram illustrating a temperature control device for a wet station adapted to prevent a heater from overheating in accordance with an exemplary embodiment of the present invention.

The heater overheating prevention device of FIG. 2 comprises a bath 50, a solution temperature sensor 52, a solution temperature controller 54, a power supply unit 56, a power supply controller 58, a pipe 68, a pump 60, a heater 62, first and second heater temperature sensors 64 and 66, first and second heater temperature controllers 70 and 72, an alarm controller 74, an alarm sound generator 76, and an alarm display 78.

Bath 50 contains a solution. Solution temperature sensor 52 is disposed in bath 50, senses the temperature of the solution, and generates a corresponding sensed solution temperature.

Solution temperature sensor 52 provides the sensed solution temperature to solution temperature controller 54, and solution temperature controller 54 compares the sensed solution temperature with a predetermined solution reference temperature (i.e., a reference temperature for the solution) and outputs a solution temperature control signal.

Power supply unit 56 selectively supplies power from an AC power source to power supply controller 58 in response to an interlock control signal.

Power supply controller 58 selectively provides the power it receives from power supply unit 56 to heater 62 (which will be described subsequently) in accordance with the solution temperature control signal it receives from solution temperature controller 54.

The solution in bath 50 (which will be referred to hereinafter as "the solution") is circulated through pipe 68. Pump 60 is disposed around a portion of pipe 68 and performs a pumping function to circulate the solution through pipe 68. Heater 62 is separated from pump 60 and heats the solution circulating through pipe 68. In addition, first and second heater temperature sensors 64 and 66 are installed in heater 62 and each individually sense the temperature of heater 62.

First heater temperature controller 70 receives a first sensed heater temperature, which is sensed by first heater temperature sensor 64, compares the first sensed heater temperature with a predetermined heater reference temperature, and provides an interlock control signal to power supply unit 56 when the first sensed heater temperature exceeds the heater reference temperature. Similarly, second heater temperature controller 72 receives a second sensed heater temperature, which is sensed by second heater temperature sensor 66, compares the second sensed heater temperature with the heater reference temperature (i.e., a heater overheating prevention reference temperature), and provides an interlock control signal to power supply unit 56 when the second sensed heater temperature exceeds the heater reference temperature. Power supply unit 56 stops supplying power to power supply controller 58 in response to an interlock control signal.

Alarm controller 74 receives the first and second sensed heater temperatures from first and second heater temperature controllers 70 and 72, respectively, and outputs an alarm sound generation control signal and an alarm display control signal to communicate that an error has occurred and simultaneously generate an alarm sound when at least one of the following conditions is met: a temperature deviation value for at least one sensed heater temperature exceeds a predetermined maximum temperature deviation amount (for example, 10° C.), there is no change in at least one sensed heater temperature for a predetermined amount of time, or a false temperature is detected in at least one sensed heater temperature. A temperature deviation value for a sensed heater temperature is the difference between the heater reference temperature and the sensed heater temperature (i.e., the temperature deviation value for the first sensed heater temperature is the difference between the heater reference temperature and the first sensed heater temperature). In addition, a false temperature is, for example, 0° C. or 1000° C.

Alarm sound generator 76 generates an alarm sound in response to an alarm sound generation control signal received from alarm controller 74. Also, alarm display 78 displays information about an error state of at least one of first and second heater temperature sensors 64 and 66; in response to an alarm display control signal received from alarm controller 74.

Referring to FIG. 2, operations of the heater overheating prevention device will now be described in more detail.

The solution is pumped from bath 50 and circulated back into bath 50 through pipe 68 and pump 60 in the direction indicated by the arrows disposed along the inner side of pipe 68 in FIG. 2. When circulated by pump 60 the solution will pass through heater 62 which heats a portion of pipe 68 so that the solution will attain the control temperature (i.e., a temperature sufficient to successfully perform the desired fabrication process). In several applicable embodiments, common fabrication processes identify a control temperature that ranges between about, 250° C. to 400° C.

Solution temperature sensor 52 is disposed in bath 50 to measure the temperature of the solution. Solution temperature sensor 52 senses the temperature of the solution and provides the sensed solution temperature to solution temperature controller 54. Solution temperature controller 54 compares the sensed solution temperature it receives from solution temperature sensor 52 with the solution reference temperature, and outputs the solution temperature control signal, which may be either a power supply control signal or a power cutoff control signal. When the sensed solution temperature is lower than the solution reference temperature, solution temperature controller 54 outputs the power supply control signal to power supply controller 58, and in response, power supply controller 58 continues to supply power to heater 62. When the sensed solution temperature is higher than the solution reference temperature, solution temperature controller 54 outputs the power cutoff control signal to power supply controller 58, and, in response, power supply controller 58 stops supplying power to heater 62. Power supply controller 58 may be realized as, for example, an SCR. Power supply unit 56 comprises a power switch and supplies power from an AC power source to power supply controller 58 when a power switch is turned on.

When power supply controller 58 supplies power to heater 62, the temperature of heater 62 increases. When power supply controller 58 does not supply power to heater 62, the temperature of heater 62 falls.

Through the above operations, heater 62 heats or stops heating pipe 68, through which the solution is circulated, in accordance with the temperature sensed by solution temperature sensor 52 (i.e., the sensed solution temperature). In other words, when the temperature of the solution, as measured by solution temperature sensor 52, has not attained the control temperature, heater 62 heats the portion of pipe 68 disposed inside of heater 62 (which will be referred to hereinafter as the heating pipe), in accordance with the operation of power supply controller 58. However, when the temperature of the solution, as measured by solution temperature sensor 52, reaches the control temperature, heater 62 temporarily stops heating the heating pipe in accordance with the operation of power supply controller 58.

In some embodiments, the control temperature may range from between about 70° C. to 150° C. The temperature of the solution is controlled as necessary for proper performance of the desired fabrication process through repeated application of the operations described above.

First and second heater temperature sensors 64 and 66 are disposed around an external face of the heating pipe disposed in heater 62. First and second heater temperature sensors 64 and 66 sense the temperature (i.e., the heating temperature) of heater 62 and respectively provide first and second sensed heater temperatures to first and second heater temperature controllers 70 and 72, respectively. Each of first and second heater temperature controllers 70 and 72 compares its respective received sensed heater temperature with the heater reference temperature (which is, for example, 400° C.) and provides an interlock control signal to power supply unit 56 to cut off the supply of power to heater 62 when the temperature of heater 62 exceeds the heater reference temperature. In one embodiment, heater temperature controllers 70 and 72 individually and respectively provide the heater reference temperature and the temperature values sensed by the second and third reference temperature sensors 64 and 66.

Power supply unit 56 comprises a power switch and is adapted to stop supplying power from the AC power source to power supply controller 58 when the power switch is turned off in response to an interlock control signal. Thus, when pipe 68 is damaged or clogged, or when solution cannot be circulated because pump 60 has broken down, at least one of first and second heater temperature controllers 70 and 72 generates an interlock control signal. The interlock control signal turns off the switch installed in power supply unit 56, so power supply unit 56 stops supplying power to power supply controller 58; and thus, power supply controller 58 stops supplying power to heater 62. Accordingly, heater 62 can be prevented from overheating.

In the conventional apparatus, one temperature sensor sensed the temperature of a heater. Thus, if an error occurred in the temperature sensor or a temperature sensing line was short circuited, causing the temperature of the heater to continually increase, the continued heating could not be prevented by the conventional apparatus. However, in accordance with an exemplary embodiment of the present invention, two temperature sensors are provided to sense the temperature of heater 62. Thus, even if an error occurs in one temperature sensor, the other temperature sensor will continue operate normally. Thus, heater 62 can be prevented from overheating and catching on fire.

FIG. 3 is a flowchart of a process for detecting the occurrence of an error in at least one heater temperature sensor and generating a warning in accordance with an exemplary embodiment of the invention.

Referring to FIGS. 2 and 3, additional operations of an exemplary embodiment of the invention will now be described in detail.

When an error occurs in at least one of first and second heater temperature sensors 64 and 66 disposed in heater 62, a warning operation is performed to alert a worker or engineer. This warning operation will now be described with reference to the flowchart of FIG. 3.

Alarm controller 74 periodically receives the first and second sensed heater temperatures, sensed by first and second heater temperature sensors 64 and 66, respectively, from first and second heater temperature control units 70 and 72, respectively (step 101). After receiving first and second sensed heater temperatures, alarm controller 74 determines whether a temperature deviation value for the first or second sensed heater temperature exceeds a predetermined maximum temperature deviation amount, which is 10° C. in the illustrated embodiment (step 102). If the temperature deviation value for the first or second sensed heater temperature exceeds the maximum temperature deviation amount, alarm controller 74 then performs step 106. If neither temperature deviation values exceeds the predetermined maximum temperature deviation amount, alarm controller 74 determines whether at least one of the first and second sensed heater temperatures has not changed for a predetermined amount of time (e.g., 1 minute) (step 103). If at least one of the first and second sensed heater temperatures has not changed for the predetermined amount of time, alarm controller 74 then performs step 106. However, if both the first and second sensed heater temperatures have changed within the predetermined amount of time, alarm controller 74 then determines whether the first or the second sensed heater temperature indicates a false temperature (e.g., 0° C. or 1000° C.) (step 104). If alarm controller 74 detects that at least one of first and second sensed heater temperatures is a false temperature, it then performs step 106. If alarm controller 74 does not detect a false temperature, alarm controller 74 then provides information about the current heater temperature and a normal state through alarm display 78 (step 105). In step 106, alarm controller 74 provides an alarm sound generation control signal to alarm sound generator 76, which generates an alarm sound in response to the alarm sound generation control signal, and alarm controller 74 provides an alarm display control signal to alarm display 78 and displays error generation information from at least one of first and second heater temperature sensors 64 and 66 through alarm display 78 (i.e., the warning operation is performed in step 106).

Though the invention has been described above in relation to the example of controlling a cleaning operation preformed at a wet station or controlling the temperature of a solution used in an etching process in accordance with an exemplary embodiment, the invention can be applied to all devices adapted to electrically control the temperature of a heater and prevent fires that may be caused by a defect in a heater temperature sensor.

As described above, in accordance with an exemplary embodiment of the invention, a plurality of temperature sensors are used to measure the temperature of a heater. In the exemplary embodiment, chemical solution may not circulate through a pipe if the pipe has been damaged or clogged, or if the pump has broken down. If one of these conditions keeps the chemical solution from circulating, when the temperature deviation value of at least one of the sensed heater temperature exceeds a maximum temperature deviation amount, no change occurs in at least one of the sensed heater temperatures for a predetermined amount of time, or a false temperature is detected in at least one of the sensed heater temperatures, then it is determined that at least one temperature sensor has a defect; and thus, power will no longer be supplied to the heater, thereby preventing a fire that could be caused by the heater overheating.

It will be apparent to those skilled in the art that modifications and variations can be made in the exemplary embodiments without departing from the scope of the invention. Thus, the present invention is intended to encompass any such modifications and variations of the invention that fall within the scope of the invention as defined by the accompanying claims.

What is claimed is:

1. A temperature control device, comprising:
a heater adapted to increase in temperature in response to received power;
a plurality of heater temperature sensors, wherein each heater temperature sensor is adapted to sense a temperature associated with the heater and generate a corresponding sensed heater temperature;
a heater temperature controller adapted to generate an interlock control signal when at least one of the sensed heater temperatures respectively sensed by the plurality of temperature sensors exceeds a heater reference temperature;
a power supply unit adapted to stop supplying power to a power supply controller when the heater temperature controller provides the interlock control signal to the power supply unit, wherein power is provided to the power supply unit by an Alternating Current (AC) power source;
an alarm controller receiving a sensed heater temperature from the heater temperature controller and adapted to generate an alarm sound generation control signal and an alarm display control signal when the sensed heater temperature does not change during a predetermined amount of time.

2. The device of claim 1, wherein the alarm controller is further adapted to generate the alarm sound generation control signal and alarm display control signal when one of the sensed heater temperatures is a false temperature or when the sensed heater temperature exceeds a maximum temperature deviation value.

3. The device of claim 2, wherein the false temperature ranges from between 0° C. to 1000° C.

4. The device of claim 2, further comprising an alarm sound generator adapted to generate an alarm sound in response to the alarm sound generation control signal received from the alarm controller.

5. The device of claim 2, further comprising an alarm display adapted to display an error state of at least one of the heater temperature sensors in accordance with receiving an alarm display control signal from the alarm controller.

6. A temperature control device adapted for use in a wet station holding a solution being heated by a heater in response to an applied power, the control device comprising:
a plurality of heater temperature sensors, each adapted to sense a temperature associated with the heater and generate a corresponding sensed heater temperature;
a plurality of heater temperature controllers, each adapted to receive a respective sensed heater temperature and generate an interlock control signal when the sensed heater temperature exceeds a heater reference temperature;
a power supply unit adapted to stop supplying power to a power supply controller in response to an interlock control signal provided by at least one of the plurality of heater temperature controllers, wherein power is provided to the power supply unit by an Alternating Current (AC) power source; and
an alarm controller receiving a sensed heater temperature associated with at least one of the plurality of heater temperature controllers and generating an alarm sound generation control signal and an alarm display control signal when the received sensed heater temperature does not change for a predetermined amount of time.

7. The device of claim 6, further comprising an alarm sound generator adapted to generate an alarm sound in response to an alarm sound generation control signal received from the alarm controller.

8. The device of claim 7, further comprising an alarm display adapted to display an error state of at least one of the heater temperature sensors in accordance with receiving an alarm display control signal from the alarm controller.

9. A temperature control device adapted for use in a wet station comprising a bath holding a solution, the control device comprising:
- a solution temperature sensor disposed within the bath and adapted to sense the temperature of the solution;
- a solution temperature controller adapted to receive a sensed solution temperature from the solution temperature sensor, compare the sensed solution temperature with a solution reference temperature, and output a solution temperature control signal;
- a power supply unit adapted to selectively provide power from an AC power source to a power supply controller in response to an interlock control signal, wherein the power supply controller is adapted to selectively provide power to a heater in accordance with the solution temperature control signal received from the solution temperature controller;
- a pipe;
- a pump disposed around the pipe and adapted to perform a pumping operation to circulate the solution through the pipe;
- a heater adapted to heat the solution circulated through the pipe;
- a plurality of heater temperature sensors disposed in the heater, adapted to generate a sensed heater temperature;
- a heater temperature controller adapted to receive a plurality of sensed heater temperatures respectively sensed by the plurality of heater temperature sensors, compare each of the sensed heater temperatures with a heater reference temperature, and provide an interlock control signal into the power supply unit when at least one of the sensed heater temperatures exceeds the heater reference temperature; and
- an alarm controller receiving a sensed heater temperature from the heater temperature controller and generating an alarm sound generation control signal and an alarm display control signal when the received sensed heater temperature does not change during a predetermined amount of time.

10. The device of claim 9, wherein the alarm controller is further adapted to generate the alarm sound generation control signal and alarm display control signal when the sensed heater temperature is a false temperature or when the sensed heater temperature exceeds a maximum temperature deviation value.

11. The device of claim 10, wherein the false temperature ranges between 0° C. to 1000° C.

12. The device of claim 10, further comprising an alarm sound generator adapted to generate an alarm sound in response to an alarm sound generation control signal received from the alarm controller.

13. The device of claim 12, further comprising an alarm display adapted to display an error state of at least one of the heater temperature sensors in accordance with receiving an alarm display control signal from the alarm controller.

* * * * *